US011011091B2

(12) United States Patent
Zhang et al.

(10) Patent No.: US 11,011,091 B2
(45) Date of Patent: May 18, 2021

(54) ARRAY SUBSTRATE FOR REDUCING COUPLING EFFECT, DISPLAY PANEL, DISPLAY DEVICE, OPERATING METHOD, AND MANUFACTURING METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiang Zhang, Beijing (CN); Dianzheng Dong, Beijing (CN); Guangxing Wang, Beijing (CN); Pengming Chen, Beijing (CN); Wenpeng Xu, Beijing (CN); Wan Lin, Beijing (CN); Haixu Wang, Beijing (CN); Leiyang Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/530,214

(22) Filed: Aug. 2, 2019

(65) Prior Publication Data
US 2020/0211434 A1 Jul. 2, 2020

(30) Foreign Application Priority Data
Jan. 2, 2019 (CN) .......................... 201910000725.3

(51) Int. Cl.
*G09G 3/20* (2006.01)
*G09G 3/3266* (2016.01)
(Continued)

(52) U.S. Cl.
CPC ............. *G09G 3/20* (2013.01); *G09G 3/3266* (2013.01); *G09G 3/3614* (2013.01);
(Continued)

(58) Field of Classification Search
CPC .............................. G09G 3/20; G09G 3/3266
See application file for complete search history.

(56) References Cited

U.S. PATENT DOCUMENTS

| 2005/0134545 A1 | 6/2005 | Jang et al. |
| 2008/0158203 A1 | 7/2008 | Irie et al. |

(Continued)

FOREIGN PATENT DOCUMENTS

| CN | 1629925 | 6/2005 |
| CN | 101053009 | 10/2007 |

(Continued)

OTHER PUBLICATIONS

Chinese Office Action dated May 7, 2020 corresponding Chinese Patent Application No. 201910000725.3; 13 pages.

*Primary Examiner* — Chun-Nan Lin
(74) *Attorney, Agent, or Firm* — Leason Ellis LLP

(57) ABSTRACT

An array substrate, a display panel, a display device, an operating method, and a manufacturing method are disclosed. The array substrate includes a wiring structure formed on a base substrate, and the wiring structure includes a common electrode line for connecting a common electrode, and a plurality of signal lines. The plurality of signal lines include at least one pair of signal lines, and the pair of signal lines include a first signal line and a second signal line. The first signal line is disposed on a first side of the common electrode line and is configured to transmit a driving signal for a gate driving circuit. The second signal line is disposed on a second side of the common electrode line and is configured to transmit an inverted signal of the driving signal.

4 Claims, 10 Drawing Sheets

(51) Int. Cl.
   *G09G 3/36* (2006.01)
   *H01L 27/12* (2006.01)
(52) U.S. Cl.
   CPC ......... *G09G 3/3677* (2013.01); *H01L 27/124* (2013.01); *H01L 27/1259* (2013.01); *G09G 2320/0233* (2013.01)

(56) References Cited

U.S. PATENT DOCUMENTS

| | | |
|---|---|---|
| 2010/0026950 A1 | 2/2010 | Furuta et al. |
| 2014/0125571 A1 | 5/2014 | Um et al. |
| 2015/0293546 A1* | 10/2015 | Tanaka ............. H03K 17/04206 327/541 |
| 2016/0240158 A1 | 8/2016 | Xu |
| 2018/0101077 A1* | 4/2018 | Xu .................... G02F 1/136286 |
| 2019/0005904 A1* | 1/2019 | Mitsuzawa .......... G09G 3/3614 |
| 2020/0004066 A1* | 1/2020 | Yoshida ............ G02F 1/136286 |

FOREIGN PATENT DOCUMENTS

| | | |
|---|---|---|
| CN | 102929054 | 2/2013 |
| CN | 103426415 | 12/2013 |
| CN | 103928005 | 7/2014 |
| CN | 104793419 | 7/2015 |

\* cited by examiner disposing the first signal line of each pair of signal lines on a first side of the common electrode line, and connecting the first signal line to a gate driving circuit to transmit a driving signal for the gate driving circuit; ──S1010 disposing the second signal line of each pair of signal lines on a second side of the common electrode line, and the second signal line is configured to transmit an inverted signal of the driving signal. ──S1020

FIG. 11

ARRAY SUBSTRATE FOR REDUCING COUPLING EFFECT, DISPLAY PANEL, DISPLAY DEVICE, OPERATING METHOD, AND MANUFACTURING METHOD

CROSS REFERENCE TO RELATED APPLICATIONS

The present application claims the priority of Chinese Patent Application No. 201910000725.3, filed on Jan. 2, 2019, the entire disclosure of which is incorporated herein by reference as part of the present application.

TECHNICAL FIELD

Embodiments of the present disclosure relate to an array substrate, a display panel, a display device, an operating method, and a manufacturing method.

BACKGROUND

In a display device, whether it is a Thin Film Transistor Liquid Crystal Display (TFT-LCD) panel or an Organic Light Emitting Diode (OLED) display panel, a gate driving circuit of the display panel can adopt a Gate Driver or a Gate on Array (GOA). A gate driving signal requires a higher driving voltage to drive the gate driving circuit, and a common electrode needs to be disposed to, for example, provide a reference voltage or form a driving loop regardless of the driving mode adopted.

The gate driving circuit is generally disposed on an array substrate of the display panel. The array substrate is provided with a plurality of signal lines at the periphery of the gate driving circuit to transmit a driving signal for the gate driving circuit, a common electrode signal, and the like. As the requirements for narrow bezel and the like in the product design of the display panel are gradually increased, the space for signal line wiring in the array substrate is gradually reduced. In this case, the signal line for transmitting the higher driving voltage and the common electrode line for transmitting the common electrode signal may require adjacent wiring, and the region of such adjacent wiring may increase with the size of the display panel. Because there may be a coupling between the signal line and the common electrode line, the reference voltage provided by the common electrode line, for example, may be disturbed by the effect of the coupling, which may cause a poor display of the display panel.

SUMMARY

At least one embodiment of the present disclosure provides an array substrate, the array substrate comprises a wiring structure formed on a base substrate, the wiring structure comprises a common electrode line for connecting a common electrode and a plurality of signal lines, the plurality of signal lines comprises at least one pair of signal lines, the pair of signal lines comprises a first signal line and a second signal line, the first signal line is disposed on a first side of the common electrode line and is configured to transmit a driving signal for a gate driving circuit, and the second signal line is disposed on a second side of the common electrode line and is configured to transmit an inverted signal of the driving signal.

For example, in the array substrate provided by the embodiments of the present disclosure, the second signal line is connected to an impedance load.

For example, in the array substrate provided by the embodiments of the present disclosure, the impedance load is a dummy gate driving unit of the gate driving circuit.

For example, in the array substrate provided by the embodiments of the present disclosure, the first signal line is connected to the gate driving circuit, and the gate driving circuit is integrated on the base substrate.

For example, in the array substrate provided by the embodiments of the present disclosure, the first side is a side of the common electrode line close to the gate driving circuit, and the second side is a side of the common electrode line away from the gate driving circuit.

For example, in the array substrate provided by the embodiments of the present disclosure, the driving signal comprises at least one clock signal for the gate driving circuit.

For example, in the array substrate provided by the embodiments of the present disclosure, the plurality of signal lines comprise a pair of signal lines, and the first signal line of the pair of signal lines is a clock signal line, closest to the common electrode line, of the plurality of signal lines for transmitting the clock signal, and the second signal line is configured to transmit an inverted signal of the clock signal.

For example, in the array substrate provided by the embodiments of the present disclosure, a vertical distance between the first signal line and the common electrode line is a first distance, a vertical distance between the second signal line and the common electrode line is a second distance, and the first distance is equal to the second distance.

For example, in the array substrate provided by the embodiments of the present disclosure, the plurality of signal lines comprises a plurality of pairs of signal lines, the driving signal comprises a plurality of clock signals for the gate driving circuit, and each of the plurality of clock signals corresponds to a pair of signal lines of the plurality of pairs of signal lines; in each of the plurality of pairs of signal lines, the first signal line is configured to transmit a clock signal corresponding to the pair of signal lines, and the second signal line is configured to transmit an inverted signal of the clock signal corresponding to the pair of signal lines.

For example, in the array substrate provided by the embodiments of the present disclosure, in each pair of signal lines, a vertical distance between the first signal line and the common electrode line is a first distance, a vertical distance between the second signal line and the common electrode line is a second distance, and the first distance is equal to the second distance.

At least one embodiment of the present disclosure further provides a display panel comprising any of the array substrates provided by the embodiments of the present disclosure.

For example, in the display panel provided by the embodiments of the present disclosure, the second signal line is connected to an impedance load.

For example, in the display panel provided by the embodiments of the present disclosure, the driving signal comprises at least one clock signal for the gate driving circuit, the plurality of signal lines comprising a pair of signal lines, the first signal line of the pair of signal lines is a clock signal line, closest to the common electrode line, of the plurality of signal lines for transmitting the clock signal, and the second signal line is configured to transmit an inverted signal of the clock signal; a vertical distance between the first signal line and the common electrode line is a first distance, a vertical distance between the second signal line and the common electrode line is a second distance, and the first distance is equal to the second distance.

For example, in the display panel provided by the embodiments of the present disclosure, the driving signal comprises a plurality of clock signals for the gate driving circuit, the plurality of signal lines comprises a plurality of pairs of signal lines, and each of the plurality of clock signals corresponds to a pair of signal lines of the plurality of pairs of signal lines; in each of the plurality of pairs of signal lines, a first signal line is configured to transmit a clock signal corresponding to the pair of signal lines, and a second signal line is configured to transmit an inverted signal of the clock signal corresponding to the pair of signal lines; in each of the plurality of pairs of signal lines, a vertical distance between the first signal line and the common electrode line is a first distance, a vertical distance between the second signal line and the common electrode line is a second distance, and the first distance is equal to the second distance.

At least one embodiment of the present disclosure further provides a display device comprising any display panel provided by the embodiments of the present disclosure.

At least one embodiment of the present disclosure further provides an operating method of an array substrate, the array substrate comprises a wiring structure formed on a base substrate, the wiring structure comprises a common electrode line for connecting a common electrode and a plurality of signal lines, the plurality of signal lines comprise at least one pair of signal lines, each pair of signal lines comprise a first signal line and a second signal line, the first signal line is disposed on a first side of the common electrode line, and the second signal line is disposed on a second side of the common electrode line side; the operating method comprises transmitting a driving signal for a gate driving circuit through the first signal line; and transmitting an inverted signal of the driving signal through the second signal line.

For example, the operating method provided by the embodiments of the present disclosure further comprising connecting the second signal line to an impedance load.

For example, the operating method provided by the embodiments of the present disclosure further comprising determining to dispose a pair of signal lines or a plurality of pairs of signal lines based on a degree of coupling of each signal line of the plurality of signal lines to the common electrode line.

For example, the operating method provided by the embodiments of the present disclosure further comprising measuring a first degree of coupling between the first signal line of each pair of signal lines and the common electrode line and a second degree of coupling between the second signal line of each pair of signal lines and the common electrode line based on a parallel wire coupling formula; and setting a first distance between the first signal line and the common electrode line and a second distance between the second signal line and the common electrode line based on the first degree of coupling and the second degree of coupling; wherein the first distance is a vertical distance between the first signal line and the common electrode line, and the second distance is a vertical distance between the second signal line and the common electrode line.

At least one embodiment of the present disclosure further provides a method of manufacturing an array substrate, the method comprises forming a wiring structure on a base substrate, wherein the wiring structure comprises a common electrode line for connecting a common electrode and a plurality of signal lines, the plurality of signal lines comprise at least one pair of signal lines, each pair of signal lines comprise a first signal line and a second signal line, forming the wiring structure on the base substrate comprises disposing the first signal line of the pair of signal lines on a first side of the common electrode line, and connecting the first signal line to a gate driving circuit to transmit a driving signal for the gate driving circuit; and disposing the second signal line of the pair of signal lines on a second side of the common electrode line, wherein the second signal line is configured to transmit an inverted signal of the driving signal.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

FIG. 11 shows a flow chart of a manufacturing method provided by at least one embodiment of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

At least one embodiment of the present disclosure provides an array substrate and a manufacturing method thereof, a display panel, and a display device for eliminating the effect of coupling between signals. In at least one embodiment of the present disclosure, by appropriately arranging the wiring structure of the array substrate, the coupling effect between signals can be reduced or avoided without changing the logic, function and basic wiring width of the original circuit on the array substrate, so that, for example, periodic stripe defect can be reduced or avoided to improve signal quality, thereby improving display performance.

Figure 1:
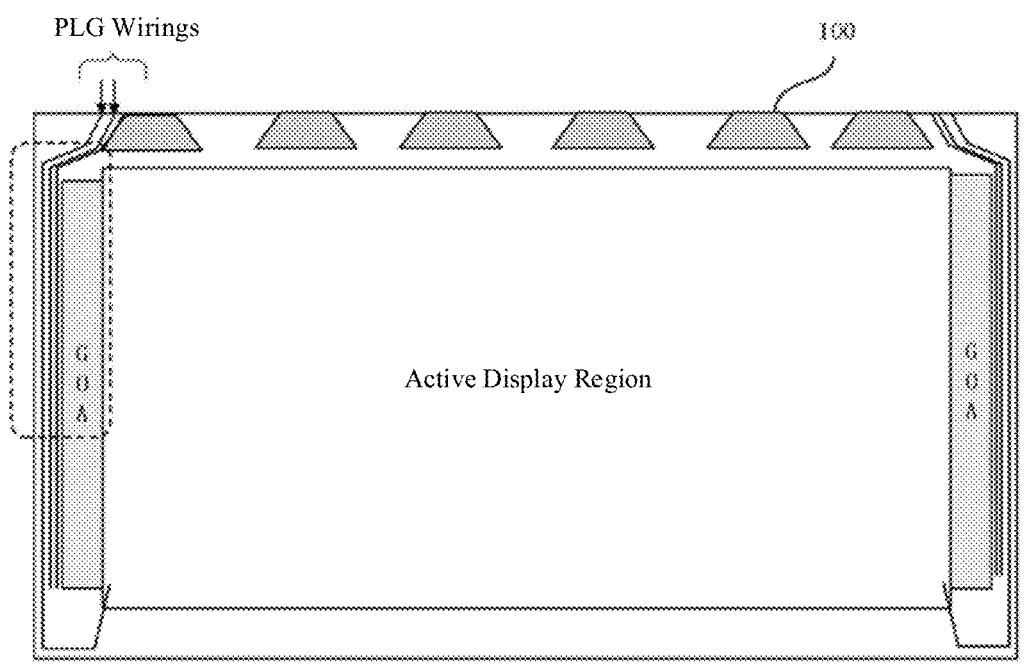
FIG. 1 shows a schematic diagram of an array substrate.

FIG. 1 shows a schematic diagram of an array substrate. As shown in FIG. 1, the array substrate 100 includes an active display region (AA region) for displaying an image and a non-display region formed in a peripheral region (e.g., a bezel) of the active display region. A circuit for display, such as a gate driving circuit (GOA), is provided in the non-display region. As shown in FIG. 1, the gate driving circuits are distributed on both sides of the array substrate 100. It should be noted that, embodiments of the present disclosure include but are not limited thereto, and the gate driving circuit can also be disposed only on one side of the array substrate, that is, adopting a form of single-sided driving.

Referring to FIG. 1, a corresponding wiring structure, such as Pattern Line on Glass (PLG) wirings, is also formed in the non-display region. As shown in the dashed block, both the PLG wirings and the GOA circuit are arranged in the peripheral region of the array substrate. Due to the product design requirement of the narrow bezel of the display panel, the region for the wiring structure in the array substrate is limited. On the other hand, with the increasing demand for the performance of display panel, such as resolution, the amount of leads involved in the PLG wirings increases accordingly. These results in a more dense distribution of wirings in the non-display region, which makes the common electrode line difficult to avoid wiring adjacent to other leads.

Figure 2:
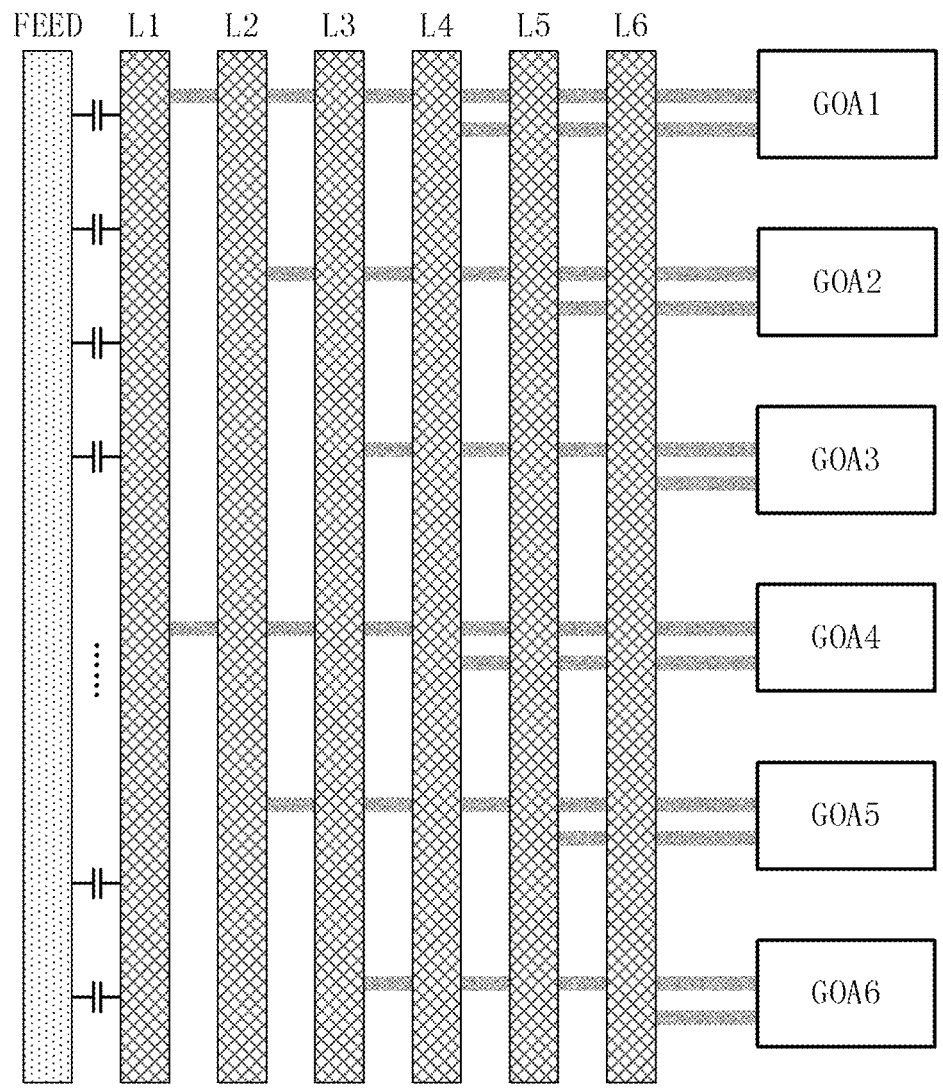
FIG. 2 shows an exemplary enlarged diagram of the dashed block as shown in FIG. 1.

FIG. 2 shows an exemplary enlarged diagram of the region within the dashed block as shown in FIG. 1. In this region of the array substrate, a plurality of gate driving units of the gate driving circuit, such as GOA1-GOA6 as shown in FIG. 2, are provided, and a wiring structure including a plurality of leads is provided. For example, the leads include a common electrode line FEED connected to a common electrode, and the common electrode line FEED is configured to transmit a common electrode signal. For example, the leads further include a plurality of signal lines, which can include signal lines L1-L6 that transmit driving signals for the gate driving units (GOA1-GOA6). The common electrode line FEED can be configured to provide a reference voltage or to form a driving loop. The signal lines (L1-L6) can be connected to the corresponding gate driving units to provide driving signals, which may include periodic driving signals, such as vertical start (STV) signals, clock signals, and the like. As shown in FIG. 2, signal lines L1 and L4 are connected to GOA1 and GOA4, signal lines L2 and L5 are connected to GOA2 and GOA5, and signal lines L3 and L6 are connected to GOA3 and GOA6.

In order to realize the narrow bezel of the display panel, the area of the region for the wiring structure is limited, so that the common electrode line FEED may be disposed adjacent to the signal line L1 as shown in FIG. 2, and thus there may be a parasitic capacitance between the common electrode line FEED and the signal line L1. When the driving signal is transmitted on the signal line L1, because the driving voltage of the driving signal is high, the voltage of the common electrode to which the common electrode line FEED is connected is significantly affected by the coupling of the signal line L1. For example, in a case where the driving signal is a large periodic signal (e.g., a clock signal), the coupling of the periodic signal transmitted by the signal line L1 to the common electrode line FEED disturbs the voltage of the common electrode, which may cause periodic display defect, such as periodic stripe phenomenon.

Figure 3:
FIG. 3 shows a waveform in which signals of a gate driving circuit are coupled.

FIG. 3 shows an exemplary coupled waveform of signals obtained from a practical circuit test of the array substrate. The coupled waveform shows a signal (hereinafter referred to as a FEED signal) transmitted on the common electrode line FEED and driving signals (STV and CLK). In this example, the corresponding leads of the respective signals on the array substrate are arranged in an order of FEED→STV→CLK. In this case, because the driving signal STV and the driving signal CLK are driving signals for the gate driving circuit, the voltages thereof are high, for example, −8V~30V, and the voltage of the FEED signal is only about 5V~6V, so the FEED signal is more affected by the coupling. As shown in FIG. 3, the voltage of the FEED signal is disturbed at a transition edge (a rising edge or a falling edge) of the driving signal STV and the driving signal CLK. Moreover, the degree of coupling of the driving signal STV to the FEED signal is significantly greater than that of the driving signal CLK to the FEED signal, which indicates that the closer the wiring, the more obvious the coupling. In addition, the rising edge of the driving signal is coupled up to the FEED signal, and the falling edge of the driving signal is coupled down to the FEED signal. In addition, because the driving signal CLK is a periodic signal, the driving signal CLK may have a periodic coupling effect on the FEED signal, for example, the effect of such periodic coupling on the display may be expressed as periodic stripes in display images.

Figure 4:
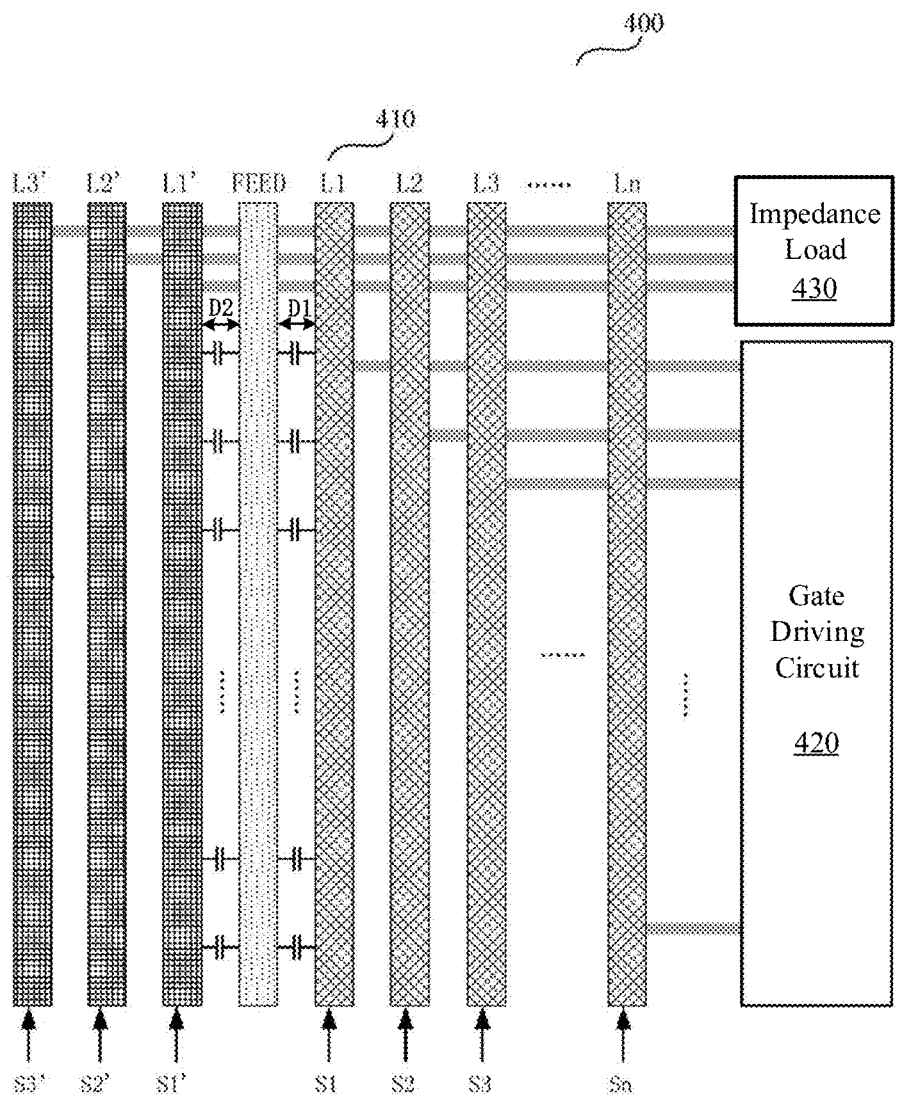
FIG. 4 shows a schematic diagram of an array substrate provided by at least one embodiment of the present disclosure.

FIG. 4 shows a schematic diagram of an array substrate 400 provided by at least one embodiment of the present disclosure. For example, the array substrate 400 includes a wiring structure 410 formed on a base substrate (not shown in FIG. 4).

For example, the wiring structure 410 includes a plurality of leads. For example, the plurality of leads include a common electrode line FEED that is connected to a common electrode for transmitting a common electrode signal. For example, in a circuit of a thin film transistor liquid crystal display device (TFT-LCD), the common electrode may refer to VCOM. VCOM is used as a common electrode of a pixel capacitor to compare with a pixel voltage, and its bias voltage is used as an actual pixel deflection voltage for driving the pixels to achieve different deflection angles of the pixels, thereby achieving different display gray levels. In addition, the common electrode may be complicated in a circuit of an organic light emitting diode (OLED) display device, and the common electrode may refer to VSS (OLED device loop) or VDD (OLED device driving terminal).

It should be noted that, although only one common electrode line FEED is shown in FIG. 4, the embodiments of the present disclosure do not limit the amount of common electrode lines FEED. For example, in a larger display device product, 4~8 groups of common electrode signals (e.g., VCOM signals) may be generally required. In this case, 2~4 common electrode lines are arranged on left and right sides of the array substrate to drive.

For example, as shown in FIG. 4, the wiring structure 410 further includes a plurality of signal lines, for example, signal lines L1, L2, L3, . . . Ln and L1', L2', L3' as shown in FIG. 4. As an example, the signal lines L1, L2, L3, . . . Ln can be connected to the gate driving circuit 420, respectively, to transmit the driving signals S1, S2, S3, . . . Sn for the gate driving circuit 420. For example, the signal lines L1, L2, L3, . . . Ln are connected to the gate driving circuit 420, respectively, for example, the gate driving circuit 420 is integrated on the base substrate of the array substrate. In this example, the signal lines L1, L2, L3, . . . Ln can be configured to transmit driving signals. The driving signal may include, but is not limited to, a vertical start signal STV, a clock signal CLK, and the like. For example, the driving signal generally has a higher driving voltage, such as −8V~30V, and the clock signal CLK is a periodic signal. For example, in some embodiments of the present disclosure, signal lines L1', L2', L3' can be connected to an impedance load 430, respectively. For example, the impedance load 430 is a low impedance load. In the following embodiments, the impedance load 430 is a low impedance load as an example, and details are not described herein.

For example, the gate driving circuit 420 includes a plurality of gate driving units, which may be cascaded and driven by driving signals to sequentially output progressive scanning signals at output terminals Gout (not shown in FIG. 4) of each gate driving unit, and the progressive scanning signals can be respectively provided to each row of pixel units of the display panel to turn on each row of pixel units row by row, thereby completing scanning display of the entire display panel.

The low impedance load 430 provides a low impedance load, for example, the low impedance load 430 is disposed outside of the active display region of the array substrate 400. In some embodiments, the low impedance load 430 can be implemented with a dummy gate driving unit (Dummy GOA) included in the gate driving circuit. Because the dummy gate driving unit itself is already present in the gate driving circuit, the introduction of the low impedance load 430 does not result in a significant increase in the width of the bezel.

The amount of clock signals can determine a period of the signal output by the gate driving circuit 420. For example, in a case where the gate driving circuit 420 is driven by six clock signals (CLK1, CLK2, CLK3, CLK4, CLK5, and CLK6), it means that the output of every six gate driving units is one period. Taking a full HD (FHD, 1080 rows) display panel as an example, the gate driving circuit 420 should have at least 1080/6=180 groups of repeated gate driving units for driving.

Figure 5:
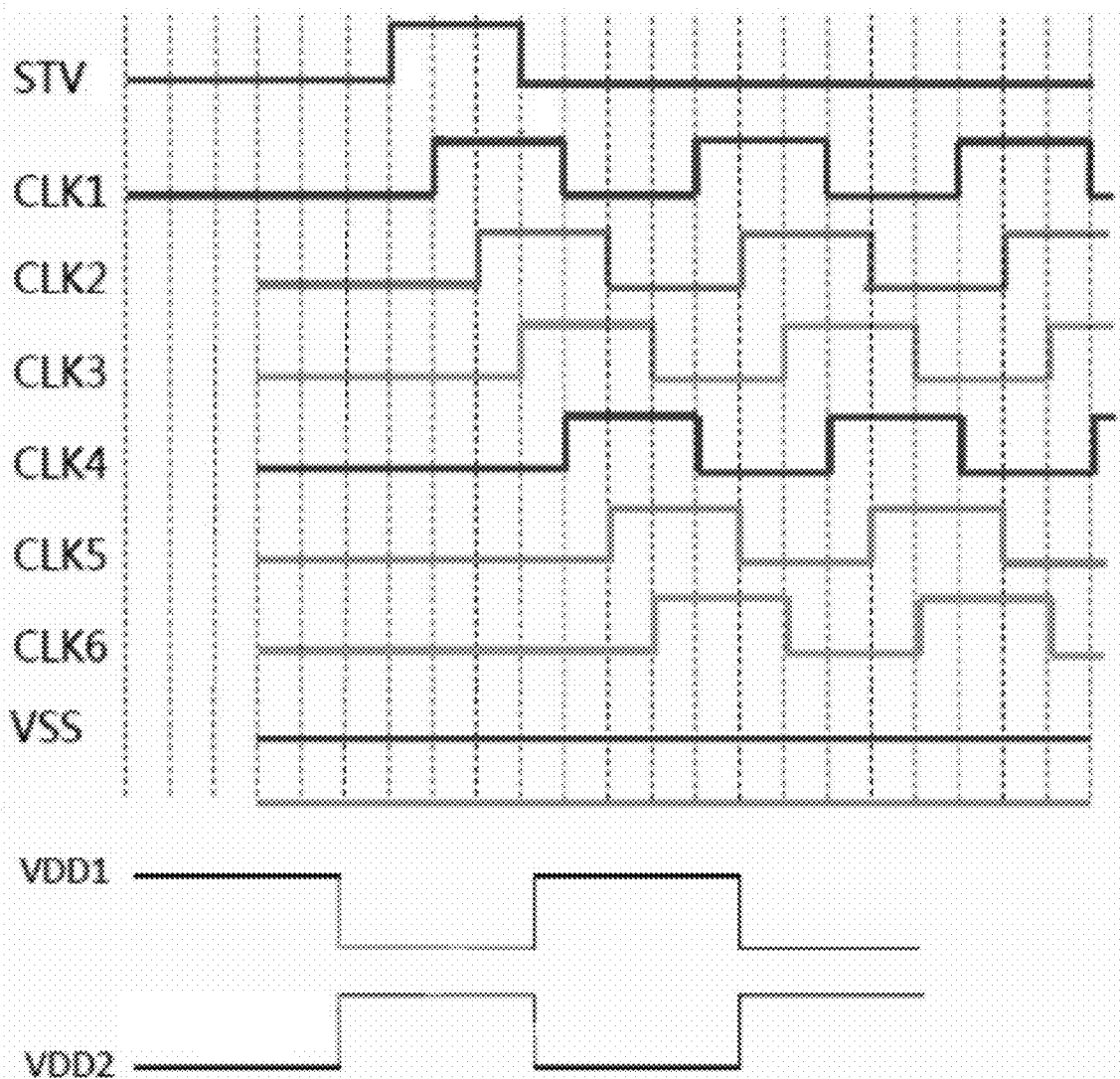
FIG. 5 shows a timing diagram of driving signals for a gate driving circuit.

FIG. 5 exemplarily shows a timing diagram of driving signals for the gate driving circuit 420 of FIG. 4, the signals adopted include a vertical start signal STV, six clock signals CLK1-CLK6, and three common electrode signals VSS, VDD1, VDD2. Taking a full high definition (FHD, 1080 rows) display panel as an example, under action of the above driving signals, the plurality of output terminals Gout1~Gout1080 of the gate driving circuit sequentially output progressive scanning signals to turn on 1080 rows of pixel units of the display panel row by row.

As shown in FIG. 5, the clock signals CLK1~CLK6 are periodically provided in one period of the vertical start signal STV (for example, can also be referred to as a frame signal, for example, in a case where a refresh rate is 60 Hz, the frame period is $1/60 \approx 16.67$ milliseconds). Thus, there are at least 180 high-to-low variation (i.e., transition edge) periods of CLKn in each frame period. The transition edge position (e.g., rising or falling edge) of the driving signal, such as the clock signal CLK, is the position at which the common electrode signals VSS, VDD1, and VDD2 are affected by the coupling. In the case that there are six clock signals as shown in FIG. 5, if the above coupling effects are not compensated, the common electrode signals may have a periodicity due to the coupling effect, for example, the periodicity is 6 rows per period, and is a cycle of 3 high–3 low. For example, the coupling effect with periodicity will cause a corresponding 3 bright–3 dark periodic stripes in a part of the display region and part of the display images.

As shown in FIG. 5, if the clock signals CLK1-CLK6 are square wave signals having a duty ratio of 50%, CLK1 and CLK4, CLK2 and CLK5, CLK3 and CLK6 of the six clock signals are mutually inverted waveforms, respectively. For example, the coupling effects of CLK1, CLK2, and CLK3 can be compensated by using, for example, CLK4, CLK5, and CLK6 according to such characteristic of a clock signal having a duty ratio of 50%. However, under actual driving conditions, it is difficult to ensure that the rising and falling edges of these paired signals, such as the CLK1 signal and the CLK4 signal, completely coincide (usually there is a time difference of nanoseconds), so the compensation effect is not ideal.

An array substrate provided by at least one embodiment of the present disclosure can reduce or avoid the coupling effect of the signal lines on the common electrode line by arranging a signal line for transmitting a driving signal on a first side of a common electrode line and a signal line for transmitting an inverted signal for the driving signal on a second side of the common electrode line, that is, transmitting pairs of mutually inverted signals on both sides of the common electrode line. It should be noted that, in the embodiments of the present disclosure, the "inverted signal" refers to two signals having opposite polarities at the same time, and the magnitudes of the two signals may be the same or different.

For example, the first side of the common electrode line is a side of the common electrode line close to the gate driving circuit, and the second side of the common electrode line is a side of the common electrode line away from the gate driving circuit.

As shown in FIG. 4, the plurality of signal lines in the wiring structure 410 include at least one pair of signal lines. Each pair of signal lines includes a first signal line and a second signal line. The first signal line may refer to a signal line that is disposed on the first side of the common electrode line FEED and have a coupling effect on the common electrode line FEED, and thus it is necessary to provide an inverted signal line for the first signal line on the second side of the common electrode line FEED. The driving signal transmitted on the first signal line may be a signal that requires coupling compensation due to its coupling effect on the common electrode signal transmitted on the common electrode line FEED. For example, in some embodiments, the first signal line can be disposed on the first side of the common electrode line FEED and be connected to the gate driving circuit 420 to transmit a driving signal for the gate driving circuit 420, and the second signal line can be disposed on the second side of the common electrode line FEED and be configured to transmit an inverted signal of the driving signal. The second signal line can also be referred to as an inverted signal line of the first signal line.

For example, in the array substrate provided by at least one embodiment of the present disclosure, the second signal line is connected to the low impedance load 430. For example, the low impedance load 430 is a dummy gate driving unit of the gate driving circuit 420.

For example, in some embodiments, the driving signal and the inverted signal corresponding to the driving signal can be provided by a timing controller (TCON) of the display panel, that is, the timing controller can simultaneously provide the driving signal and the inverted signal corresponding to the driving signal. For another example, in some other embodiments, an inverted signal of a certain driving signal can also be generated based on the driving signal by using an inverter or any other suitable technique.

In the embodiments of the present disclosure, because the inverted signal can be correspondingly provided according to the driving signal or generated based on the driving signal, the driving signal for which coupling compensation can be performed is no longer limited to a clock signal having a duty ratio of 50%, but can be any driving signal having a suitable waveform. Moreover, because the inverted signal provided or generated can be precisely aligned with the driving signal, the array substrate provided by the embodiment of the present disclosure can further improve the elimination of the coupling effect.

For example, as shown in FIG. 4, the signal line L1 and the signal line L1' can constitute a pair of signal lines, in which the first signal line is L1 and the second signal line is L1'. For example, the first signal line L1 can be connected to one (or more) of the gate driving units in the gate driving circuit 420 to provide a driving signal. Among the pair of signal lines, the first signal line L1 is disposed on the first side of the common electrode line FEED, and the second signal line L1' is disposed on the second side of the common electrode line FEED. For example, the first side of the common electrode line FEED is the side of the common electrode line FEED close to the gate driving circuit 420, and the second side is the side of the common electrode line FEED away from the gate driving circuit 420. The second signal line L1' is configured to transmit a second signal S1' which is an inverted signal of the first signal S1 on the first signal line L1.

In the embodiments of the present disclosure, by arranging such a pair of signal lines, the second signal line of the pair of signal lines transmits the inverted signal S1', so that the coupling effect of the driving signal S1 transmitted on the first signal line of the pair of signal lines on the common electrode line FEED can be compensated, thereby reducing or avoiding the disturbing effect of the driving signal on the common electrode voltage.

In some embodiments, two or more pairs of signal lines can also be included based on the degree of the coupling effect of the signal lines on the common electrode line FEED. Three pairs of signal lines are exemplarily shown in FIG. 4, which include a first signal line L1 and a second signal line L1', a first signal line L2 and a second signal line L2', and a first signal line L3 and a second signal line L3', respectively. These pairs of signal lines respectively transmit a first signal and a second signal which are mutually inverted, such as the first signal S1 and the second signal S1', the first signal S2 and the second signal S2', and the first signal S3 and the second signal S3'. It should be understood that although three pairs of signal lines are shown in FIG. 4, the embodiments of the present disclosure are not limited thereto, and other amount of pairs of signal line can be present. Moreover, although the first signal lines of each pair of signal lines are illustrated as being located on the same side of the common electrode line FEED, the embodiments of the present disclosure include but are not limited thereto. It will be appreciated that the first signal line and the second signal line of each pair of signal lines can be arranged in any suitable manner as long as they are on different sides of the common electrode line FEED.

In some embodiments, the vertical distance between the first signal line of each pair of signal lines and the common electrode line FEED is referred to as a first distance D1 (e.g., the vertical distance between the first signal line L1 and the common electrode line FEED in FIG. 4), and the vertical distance between the second signal line and the common electrode line FEED is referred to as a second distance D2 (e.g., the vertical distance between the second signal line L1' and the common electrode line FEED in FIG. 4). The first distance D1 and the second distance D2 can be set according to a first degree of coupling between the first signal line and the common electrode line FEED, and a second degree of coupling between the second signal line and the common electrode line FEED.

For example, in some embodiments, the first distance D1 and the second distance D2 are equal.

For example, a degree of coupling between two parallel wires (wire 1 and wire 2) can be measured by calculation based on a parallel wire coupling formula (first formula (1)) as shown below:

$$\begin{cases} u_1 = Z_{11}i_1 + Z_{12}i_2 \\ u_2 = Z_{21}i_1 + Z_{22}i_2 \end{cases}. \qquad (1)$$

In the first formula (1), $u_1$ and $u_2$ are the voltages on the wires 1 and 2, respectively, $Z_{11}$ and $Z_{22}$ are the self-impedances of the wires 1 and 2, respectively, $Z_{12}$ and $Z_{21}$ are the mutual impedance between the wires 1 and 2, and $i_1$ and $i_2$ are the currents on the wires 1 and 2, respectively.

Assuming that $i_2=0$, and $Z_{12}=Z_{21}$, a second formula (2) as shown below can be obtained from the first formula (1):

$$u_2 = \frac{Z_{12}}{Z_{11}}u_1 = ku_1. \qquad (2)$$

In the second formula (2), $$k = \frac{Z_{12}}{Z_{11}}$$

is referred to as a coupling coefficient of the wire 1 to the wire 2, and the mutual impedance $Z_{12}$ increases as the distance between the wires 1 and 2 decreases. Therefore, the closer the distance between the wires, the larger the coupling coefficient k. According to the second formula (2), the larger the coupling coefficient k, the larger $u_2$, which means that the degree of coupling of the wire 1 to the wire 2 is greater.

In some embodiments, after the first degree of coupling between the first signal line of each pair of signal lines and the FEED common electrode line, and the second degree of coupling between the second signal line of each pair of signal lines and the common electrode line FEED are measured according to the parallel wire coupling formula (i.e., the first formula (1)), the distance between the first signal line of each pair of signals lines and the common electrode line FEED, and the distance between the second signal line of each pair of signal lines and the common electrode line FEED can be set based on first degree of coupling and the second degree of coupling, respectively.

For example, the distance between the first signal line and the second signal line from the common electrode line FEED can be set such that the first signal line and the second signal line have the same or similar coupling coefficient to the common electrode line FEED, thereby causing the two signal lines to have the same or similar degree of coupling effect on the common electrode line FEED. Optionally, the first signal line and the second signal line of each pair of signal lines can be symmetrically arranged with respect to the common electrode line FEED. It can be understood that in this case, the first distance D1 and the second distance D2 are equal, and thus the first signal line and the second signal line have the same or similar degree of coupling effect on the common electrode line FEED. Because the signals transmitted on the first signal line and the second signal line are mutually inverted signals, the first signal line and the second signal line have opposite coupling effects on the common electrode line FEED. In a case where the amplitudes of the mutually inverted signals on the first signal line and the second signal line are equal, the influence of the two signal lines on the common electrode line FEED is completely offset.

Figure 6:
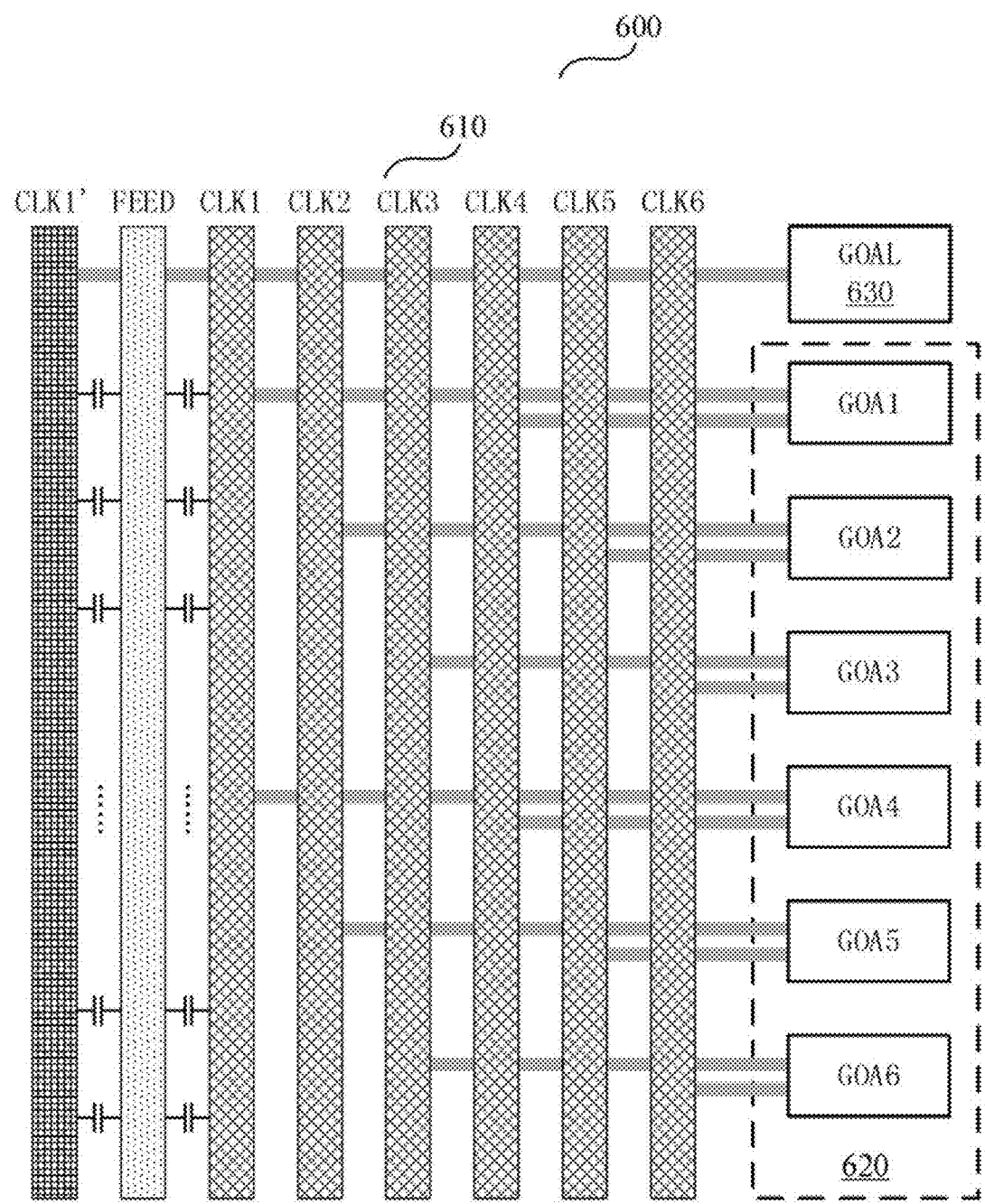
FIG. 6 shows a schematic diagram of another array substrate provided by at least one embodiment of the present disclosure.

FIG. 6 shows a schematic diagram of an array substrate 600 provided by at least one embodiment of the present disclosure. Similar to FIG. 4, the array substrate 600 includes a wiring structure 610 formed on a base substrate.

For example, the wiring structure 610 includes a common electrode line FEED, the common electrode line FEED is connected to a common electrode to, for example, provide a reference voltage or form a driving loop. For example, the wiring structure 610 further includes a plurality of signal lines. Six signal lines are exemplarily shown in FIG. 6, which can be connected to a corresponding gate driving circuits 620 to provide gate driving signals. To simplify the description, the gate driving circuit 620 is schematically represented as six gate driving units GOA1-GOA6. It should be understood that the amount of gate driving units is not limited thereto, but can be determined according to the resolution of the display panel or the like.

In FIG. 6, the signal lines are exemplified as clock signal lines CLK1-CLK6 that transmits clock signals. Moreover, the clock signal lines CLK1-CLK6 are sequentially disposed on the side of the common electrode line FEED close to the gate driving circuit 620.

In some embodiments, which one or some of the signal lines are to be used as the first signal line can be determined according to the degree of coupling of each signal line to the common electrode line FEED. Optionally, a signal line having the greatest degree of coupling to the common electrode line FEED can be determined as the first signal line. In this example, because the distances of the clock signal lines CLK1-CLK6 from the common electrode line FEED are successively increased, the degrees of coupling of the clock signal lines CLK1-CLK6 to the common electrode line FEED are successively reduced. Because the clock signal lines CLK1-CLK6 appear in pairs, three sets of different timing positions are presented in the degree of coupling to the common electrode line FEED. In terms of the degree of coupling, CLK¼ is the largest and CLK⅜ is the smallest. CLK¼ is separately described below, because CLK1 is significantly closest to the common electrode line FEED, the common electrode line FEED is mainly affected by the coupling of CLK1, that is, the signal line having the greatest coupling effect is the clock signal line CLK1. Therefore, the clock signal line CLK1 can be selected as the first signal line, and accordingly, the second signal line CLK1' is provided for the first signal line on the other side of the common electrode line FEED. For example, the second signal line CLK1' can be connected to a low impedance load GOAL 630 to form a signal loop.

In the embodiments of the present disclosure, by providing pairs of signal lines on both sides of the common electrode line FEED and transmitting mutually inverted signals through the pairs of signal lines, the coupling effect of the signal lines on the common electrode line FEED can be reduced or avoided, thereby improving the display performance of the display panel.

It should be noted that, although only one pair of signal lines (the first signal line CLK1 and the second signal line CLK1') is shown in FIG. 6, the embodiments of the present disclosure include but are not limited thereto. In some embodiments, the amount of signal lines for which coupling compensation need to be performed, that is, the amount of second signal lines that need to be disposed, can be determined according to the degree of coupling effect of the signal line on the common electrode line FEED.

Figure 7:
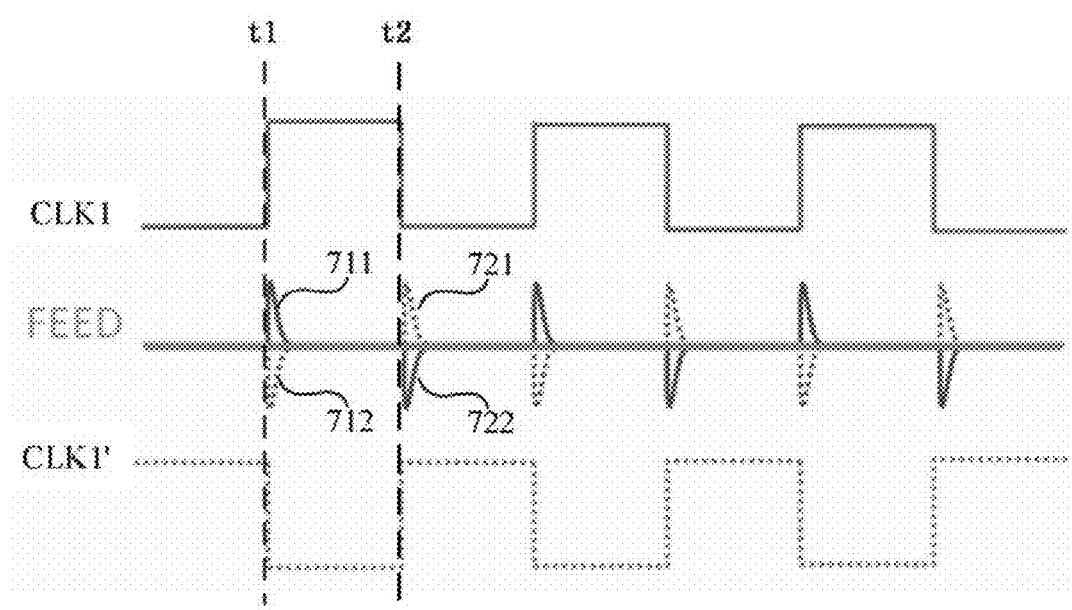
FIG. 7 shows a schematic diagram in which the coupling between signals is offset provided by at least one embodiment of the present disclosure.

FIG. 7 shows a schematic diagram in which the coupling between signals is offset provided by at least one embodiment of the present disclosure. Combining with FIG. 6, the description will be made by taking the example in which the clock signal line CLK1 is provided with the inverted signal line CLK1'. The signal transmitted by the clock signal line CLK1 is a clock signal and is a periodic signal, and accordingly, the signal transmitted by the inverted signal line CLK1' is also a periodic signal, and the signal transmitted by the inverted signal line CLK1' and the signal transmitted by the clock signal line CLK1 are mutually inverted signals. The characteristics of CLK1 and CLK1' are that CLK1' maintains at a low level during the period when CLK1 is maintained at a high level, and CLK' maintains at a high level during the period when CLK1 is maintained at a low level. That is, CLK1 and CLK1' are signals which are mutually inverted. For example, the common electrode signal (which may also be referred to as a common voltage signal) applied to the common electrode is transmitted on the common electrode line FEED, for example, the common electrode signal is a signal that remains stable.

In this case, in a case where the signal lines CLK1 and CLK1' are respectively disposed on both sides of the common electrode line FEED, each of CLK1 and CLK1' generates an upward coupling of the FEED signal at its rising edge and a downward coupling of the FEED signal at its falling edge. Because CLK1 and CLK1' are mutually inverted signals, at a time t1, the rising edge of CLK1 generates an upward coupling 711 to the FEED signal, while the falling edge of CLK1' generates a downward coupling 712 to the FEED signal. The disturbances caused by the upward coupling 711 and the downward coupling 712 to the FEED signal are exactly opposite, so that the pair of signal lines thus arranged can partially or completely offset the coupling effects of CLK1 and CLK1' on the FEED signal. In some examples, in a case where CLK1' is specifically arranged such that the degree of downward coupling generated by CLK1' is substantially the same as the degree of upward coupling generated by CLK1, the upper coupling effect of CLK1 on the FEED signal can even be completely offset.

Similarly, at a time t2, CLK1 generates a downward coupling 721 to the FEED signal, while CLK1' generates an upward coupling 722 to the FEED signal, thereby also reducing or avoiding the downward coupling effect of CLK1 on the FEED signal.

In the embodiments of the present disclosure, the coupling effect on a certain common electrode line can be balanced by providing an inverted signal line for signal lines having a large coupling effect at substantially opposite positions.

Figure 8:
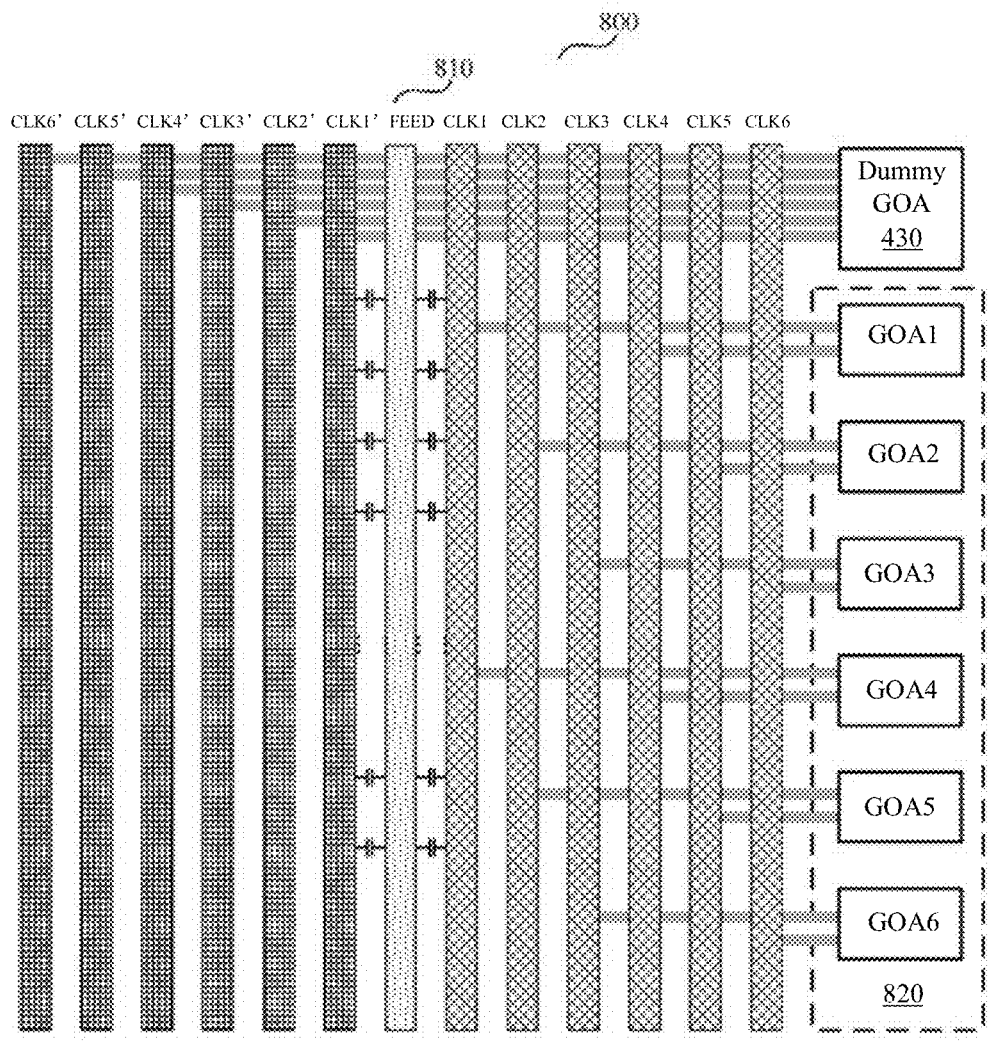
FIG. 8 shows a schematic diagram of still another array substrate provided by at least one embodiment of the present disclosure.

FIG. 8 shows a schematic diagram of still another array substrate 800 provided by at least one embodiment of the present disclosure. Similar to FIG. 6, the array substrate 800 includes a wiring structure 810 formed on a base substrate. The array substrate 800 further includes a gate driving circuit 820 exemplified as gate driving units GOA1-GOA6 and a low impedance load exemplified as a dummy GOA 830. The difference from FIG. 6 is that, in the wiring structure of the array substrate 800 as shown in FIG. 8, all the signal lines for transmitting the driving signals to the gate driving circuit 820 are determined as the first signal lines. Thus, for each of the signal lines on the first side of the common electrode line FEED, a corresponding second signal line, i.e., an inverted signal line, is disposed on the second side of the common electrode line FEED, that is, the signal lines and the inverted signal lines are disposed in a completely mirrored manner.

As shown in FIG. 8, with respect to the common electrode line FEED, the signal lines (e.g., the clock signal lines CLK1-CLK6) and their corresponding inverted signal lines (e.g., CLK1'-CLK6') are mirror-image distributed on both sides of the common electrode line FEED, that is, each signal line and its corresponding inverted signal line are symmetrically arranged with respect to the common electrode line FEED, thereby balancing the coupling effects on the common electrode line FEED.

In the embodiments of the present disclosure, the coupling effects on a certain one or some of the common electrode lines FEED can be reduced or avoided by disposing the signal lines and the inverted signal lines in a completely mirrored manner.

At least one embodiment of the present disclosure provides an array substrate that can effectively improve coupling between signal lines. The array substrate can reduce or avoid the coupling effect between the signals by setting the wiring structure without changing the logic, function, and basic wiring width of the original circuit, thereby reducing or avoiding, for example, periodic stripe defects and improving signal quality to improve display performance.

Figure 9:
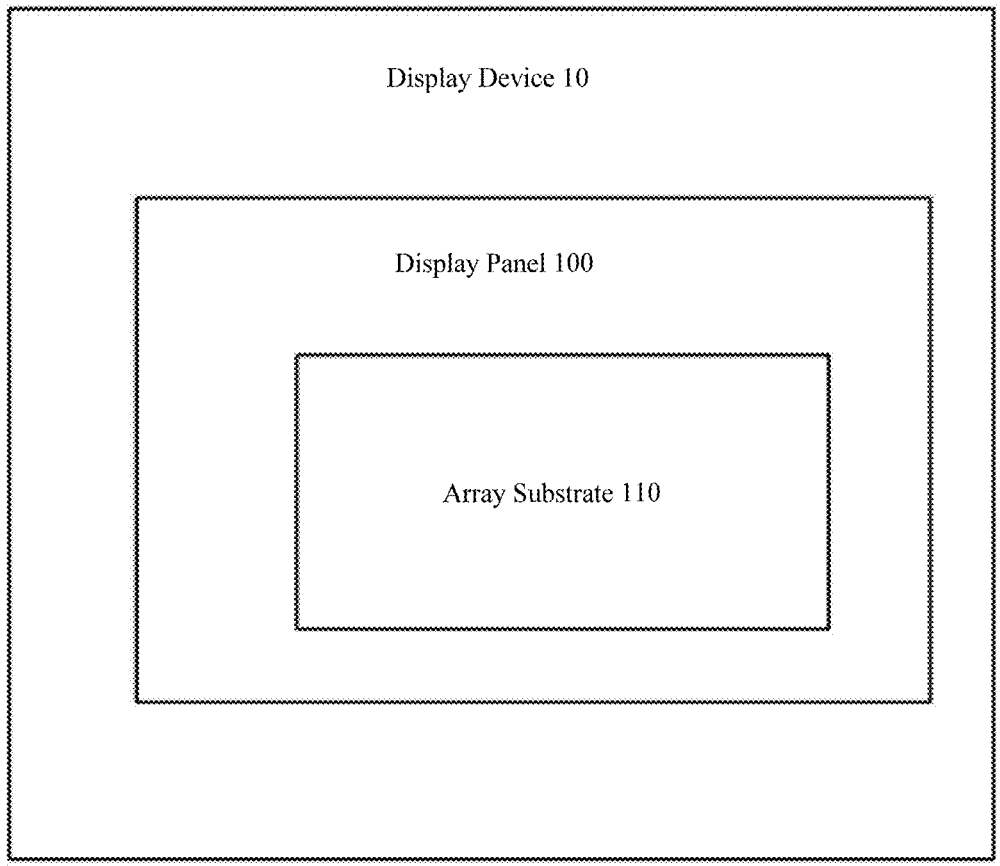
FIG. 9 shows a schematic diagram of a display device and a display panel provided by at least one embodiment of the present disclosure.

FIG. 9 illustrates a display panel 100 provided by at least one embodiment of the present disclosure. As shown in FIG. 9, the display panel 100 includes any of the array substrates 110 provided by the embodiments of the present disclosure. For example, the array substrate 110 can adopt the array substrates 400, 600, and 800 and the like described above in conjunction with the drawings.

It should be noted that, the embodiments of the present disclosure do not limit the type of the display panel 100. For example, the display panel 100 may be a display panel such as a TFT-LCD, an OLED, a quantum dot display panel, an electronic paper display panel, or a Micro-LED display panel.

At least one embodiment of the present disclosure further provides a display device 10. As shown in FIG. 9, the display device 10 includes any of the display panels 100 provided by embodiments of the present disclosure.

In some embodiments, the display device 10 can be any electronic device having a display function such as an electronic paper, a mobile phone, a tablet computer, a television, a display, a notebook computer, a digital photo frame, a navigator, and the like.

In some embodiments, the display device 10 further includes a signal receiving circuit, a video signal decoding circuit, and the like so as to receive and process video signals, or further includes a communication circuit, such as a modulation and demodulation circuit or an antenna, as needed so as to connect with other devices through a wired or wireless network or the like.

At least one embodiment of the present disclosure provides an operating method of an array substrate, for example, the array substrate can be any array substrate provided by the embodiments of the present disclosure. For example, the array substrate includes a wiring structure formed on a base substrate, the wiring structure includes a common electrode line for connecting the common electrode, and a plurality of signal lines, the plurality of signal lines include at least one pair of signal lines, each pair of signal lines include a first signal line and a second signal line, the first signal line is disposed on a first side of the common electrode line, and the second signal line is disposed on a second side of the common electrode line. For detailed descriptions of the array substrate, reference can be made to the corresponding description in the above embodiments, and details are not described herein again.

Figure 10:
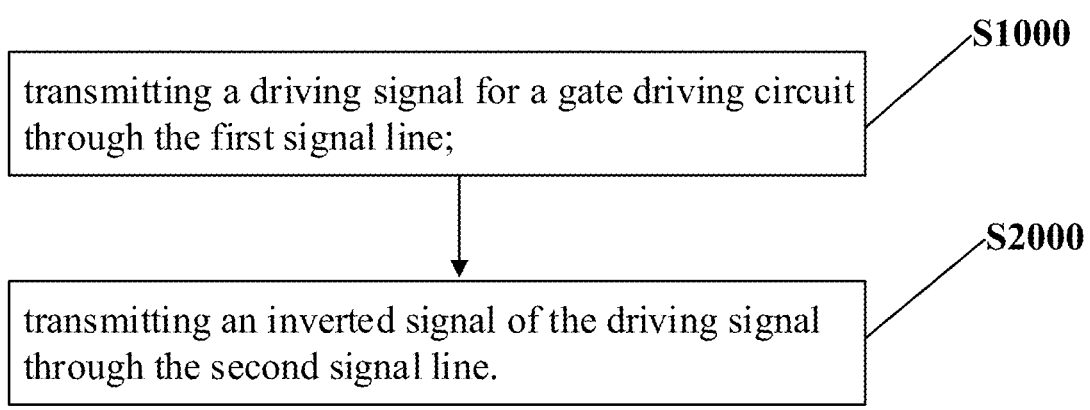
FIG. 10 shows a flow chart of an operating method provided by at least one embodiment of the present disclosure.

For example, as shown in FIG. 10, the operating method includes the following operating steps.

S1000: transmitting a driving signal for a gate driving circuit through the first signal line;

S2000: transmitting an inverted signal of the driving signal through the second signal line.

For example, the first side is a side of the common electrode line close to the gate driving circuit, and the second side is a side of the common electrode line away from the gate driving circuit.

The operating method provided by the embodiment of the present disclosure can reduce or avoid the coupling effect between signals, thereby reducing or avoiding, for example, periodic stripe defects and improving signal quality to improve the display performance.

In some embodiments, the above operating method further includes: connecting the second signal line to a low impedance load. For the low impedance load, reference can be made to the corresponding description in the above embodiments, and details are not described herein again.

In some embodiments, the above operating method further includes: determining to dispose a pair of signal lines or a plurality of pairs of signal lines based on a degree of coupling of each signal line of the plurality of signal lines to the common electrode lines. For example, one or more signal lines are determined as the first signal line based on the degree of coupling of each of the plurality of signal lines to the common electrode line. For example, a signal line having a large degree of coupling (that is, a large disturbance to the common electrode signal) can be determined as the first signal line, and a paired second signal line is disposed thereto. For another example, all of the clock signal lines of the signal lines can be determined as the first signal line.

In some embodiments, the distance between the first signal line of each pair of signal lines and the common electrode line, and the distance between of the second signal line of each pair of signal lines and the common electrode line can be properly arranged to most effectively eliminate the coupling effect. For example, the first signal line and the second signal line of each pair of signal lines can be symmetrically disposed with respect to the common electrode line.

In some embodiments, the above operating method further includes: measuring, based on a parallel wire coupling formula, a first degree of coupling between the first signal line of each pair of signal lines and the common electrode line, and a second degree of coupling between the second signal line of each pair of signal lines and the common electrode line; and setting a first distance between the first signal line and the common electrode line, and a second distance between the second signal line and the common electrode line based on the first degree of coupling and the second degree of coupling. The first distance is a vertical distance between the first signal line and the common electrode line, and the second distance is a vertical distance between the second signal line and the common electrode line.

At least one embodiment of the present disclosure further provides a method of manufacturing an array substrate which comprises forming a wiring structure on a substrate. The wiring structure includes a common electrode line for connecting the common electrode and a plurality of signal lines, the plurality of signal lines including at least one pair of signal lines, each pair of the signal lines including the first signal line and the second signal line. It should be noted that, for the wiring structure, reference can be made to the corresponding description in the above embodiments, and details are not described herein again. For example, as shown in FIG. 11, forming the wiring structure on the base substrate includes the following operating steps.

Step S1010: disposing the first signal line of each pair of signal lines on a first side of the common electrode line, and connecting the first signal line to a gate driving circuit to transmit a driving signal for the gate driving circuit;

Step S1020: disposing the second signal line of each pair of signal lines on a second side of the common electrode line, and the second signal line is configured to transmit an inverted signal of the driving signal.

What have been described above are only specific implementations of the present disclosure, the protection scope of the present disclosure is not limited thereto. The protection scope of the present disclosure should be based on the protection scope of the claims.

What is claimed is:
1. A display panel, comprising:
an array substrate comprising:
   a wiring structure formed on a base substrate, the wiring structure comprising:
     a common electrode line, and
     a plurality of signal lines, wherein the common electrode line is for connecting to a common electrode,
       wherein the plurality of signal lines comprises a pair of signal lines, and wherein the pair of signal lines comprises a first signal line, and a second signal line,
       wherein the first signal line is disposed on a first side of the common electrode line and is configured to transmit a driving signal for a gate driving circuit, and wherein the second signal line is disposed on a second side of the common electrode line and is configured to transmit an inverted signal of the driving signal, and wherein the second signal line is connected to an impedance load;
   wherein the driving signal comprises at least one clock signal for the gate driving circuit, wherein the first signal line of the pair of signal lines is a clock signal line for transmitting the clock signal, wherein the first signal line is closest to the common electrode line, and wherein the second signal line is configured to transmit an inverted signal of the clock signal; and
   wherein a vertical distance between the first signal line and the common electrode line is a first distance, wherein a vertical distance between the second signal line and the common electrode line is a second distance, and wherein the first distance is equal to the second distance.

2. The display panel according to claim 1, wherein the impedance load is a dummy gate driving unit of the gate driving circuit.

3. The display panel according to claim 1, wherein the first signal line is connected to the gate driving circuit, and the gate driving circuit is integrated on the base substrate.

4. The display panel according to claim 1, wherein the first side is a side of the common electrode line close to the gate driving circuit, and the second side is a side of the common electrode line away from the gate driving circuit.

* * * * *